United States Patent
Conte et al.

(10) Patent No.: US 10,127,966 B2
(45) Date of Patent: Nov. 13, 2018

(54) READING CIRCUIT WITH A SHIFTING STAGE AND CORRESPONDING READING METHOD

(71) Applicants: STMicroelectronics S.r.l., Agrate Brianza (IT); STMicroelectronics (Crolles 2) SAS, Crolles (FR); STMicroelectronics (Rousset) SAS, Rousset (FR)

(72) Inventors: Antonino Conte, Tremestieri Etneo (IT); Enrico Castaldo, Catania (IT); Raul Andres Bianchi, Myans (FR); Francesco La Rosa, Rousset (FR)

(73) Assignees: STMicroelectronics (Crolles 2) SAS, Crolles (FR); STMicroelectronics (Rousset) SAS, Rousset (FR); STMicroelectronics S.r.l., Agrate Brianza (MB) (IT)

( * ) Notice: Subject to any disclaimer, the term of this patent is extended or adjusted under 35 U.S.C. 154(b) by 26 days.

(21) Appl. No.: 15/389,751

(22) Filed: Dec. 23, 2016

(65) Prior Publication Data

US 2018/0005684 A1    Jan. 4, 2018

(30) Foreign Application Priority Data

Jun. 29, 2016  (IT) .................. 102016000067279

(51) Int. Cl.
*G11C 11/24*    (2006.01)
*G04F 10/10*    (2006.01)

(52) U.S. Cl.
CPC .............. *G11C 11/24* (2013.01); *G04F 10/10* (2013.01)

(58) Field of Classification Search
CPC ........ G11C 16/32; G11C 11/24; G11C 7/1051
See application file for complete search history.

(56) References Cited

U.S. PATENT DOCUMENTS

| | | | | |
|---|---|---|---|---|
| 6,538,930 B2 * | 3/2003 | Ishii | .................. | G11C 5/145 365/185.27 |
| 6,829,164 B2 * | 12/2004 | Owen | ................ | G11C 16/3468 365/185.03 |
| 6,894,928 B2 * | 5/2005 | Owen | .................... | G05F 3/262 365/185.14 |
| 8,537,635 B2 * | 9/2013 | Yoshida | ............... | G11C 7/1048 365/203 |
| 9,110,116 B2 | 8/2015 | La Rosa et al. | | |

(Continued)

*Primary Examiner* — Tuan T Nguyen
(74) *Attorney, Agent, or Firm* — Slater Matsil, LLP

(57) ABSTRACT

A reading circuit for a charge-retention circuit stage is provided with a storage capacitor coupled between a first biasing terminal and a floating node, and a discharge element coupled between the floating node and a reference terminal. The reading circuit further has an operational amplifier having a first input terminal that is coupled to the floating node and receives a reading voltage, a second input terminal receives a reference voltage, and an output terminal on which it supplies an output voltage, the value of which is a function of the comparison between the reading voltage and the reference voltage and indicative of a residual charge in the storage capacitor. A shifting stage shifts the value of the reading voltage of the floating node, before the comparison is made between the reading voltage and the reference voltage for supplying the output voltage.

22 Claims, 3 Drawing Sheets

(56) References Cited

U.S. PATENT DOCUMENTS

| | | | |
|---|---|---|---|
| 2002/0089889 A1* | 7/2002 | Ishii | G11C 5/145 |
| | | | 365/226 |
| 2004/0145945 A1* | 7/2004 | Owen | G11C 16/10 |
| | | | 365/185.02 |
| 2004/0160823 A1* | 8/2004 | Owen | G11C 16/3468 |
| | | | 365/185.1 |
| 2010/0020648 A1 | 1/2010 | La Rosa | |
| 2011/0007567 A1 | 1/2011 | Modave et al. | |
| 2015/0043269 A1 | 2/2015 | La Rosa et al. | |
| 2016/0033937 A1* | 2/2016 | Fornara | G11C 16/0433 |
| | | | 324/76.11 |

* cited by examiner

READING CIRCUIT WITH A SHIFTING STAGE AND CORRESPONDING READING METHOD

CROSS-REFERENCE TO RELATED APPLICATIONS

This application claims priority to Italian Patent Application No. 102016000067279, filed on Jun. 29, 2016, which application is hereby incorporated herein by reference.

TECHNICAL FIELD

The present invention relates to a reading circuit for a long-time-constant (LTC) circuit stage, and to a corresponding reading method.

BACKGROUND

There are several applications in which in an electronic device it is required to wait for a pre-set time, which may even have a long duration (minutes or hours). It may further be required for this wait time to be measured also in the case where the electronic device is in a state where it is turned off, de-activated, or blocked.

For example, in secure microcontrollers (the so-called secure MCUs) applications, e.g., for operations of authentication, communication, or secure information storage, when an attack is detected aimed at stealing sensitive information; the electronic device in which the secure microcontroller is used is set in a disabled state.

Typically, in case of repeated attacks, the electronic device is set in a definitive disabled state for protecting the sensitive information. However, this defensive behavior entails subsequent impossibility for the user to operate the electronic device.

It is thus preferable to set the electronic device in a blocking state for a time sufficiently long (minutes or hours) for preventing the attack from being successful (it is difficult to violate the device if, after an attack, it is necessary to wait for a long period of time to unblock the same electronic device), at the same time preserving the possibility for the user to continue to operate the device.

For this purpose, a long-time-constant circuit stage (in what follows "LTC stage") is used, basically constituted by a charge-retention electronic circuit, which defines an extremely long RC time constant for discharge of a previously stored electric charge (this time constant determines the wait time interval prior to restoring functionality of the electronic device). The resistance defining the RC time constant may have, for example, values of the order of P$\Omega$ ($10^{15}\Omega$) for defining a discharge time of the order of minutes or even hours.

The LTC stage may moreover be set (programmed), or reset (erased), by applying appropriate biasing signals.

An LTC stage is described, for example, in US 2015/0043269, which is incorporated herein by reference. This LTC stage is illustrated in FIG. 1, where it is designated by 1, and is basically a charge-retention electronic circuit for time measurement, including a capacitive charge-storage element in which discharge occurs by a slow process of leakage through the dielectric space of the same capacitive element.

In particular, the LTC stage 1 comprises: a storage capacitor 2, coupled between a first biasing terminal 3a, set in use at a first biasing voltage $V_1$, and a floating node 4; a transfer capacitor 5, coupled between a second biasing terminal 3b, set in use at a second biasing voltage $V_2$, and the floating node 4; and a discharge element 6, coupled between the same floating node 4 and a reference terminal 7, set in use at a reference voltage or ground (gnd).

In particular, the discharge element 6 is formed by a plurality of elementary discharge units 8, which are coupled together in series between the aforesaid floating node 4 and the aforesaid reference terminal 7 and define between them a plurality of intermediate nodes $N_i$ (where i is an integer corresponding to the number of elementary discharge units 8, minus one).

As described in detail in the aforesaid document US 2015/0043269 A1, each elementary discharge unit 8 comprises a first electrode and a second electrode (made, for example, of polysilicon), arranged between which is a thin dielectric layer, through which a transfer of charges by the tunnel effect occurs. The connection in series between the various elementary discharge units 8 is implemented by the coupling between the first electrode or the second electrode of consecutive elementary discharge units 8 in the series.

The floating node 4 is kept floating, i.e., isolated, separated by a dielectric space, from the terminals where the voltage is applied and is not directly coupled to any non-isolated region of the substrate of semiconductor material in which the LTC stage 1 is provided.

The capacitance $C_1$ of the storage capacitor 2 (for example, comprised between 1 and 100 pF) is much higher than the capacitance $C_2$ of the transfer capacitor 5 (for example, comprised between 0.01 and 50 pF); moreover, the thickness of the dielectric layer of the storage capacitor 2 (for example, comprised between 150 and 200 Å), made, for example, of oxide-nitride-oxide (ONO) dielectric, is greater than the respective thickness of the transfer capacitor 5 (for example, comprised between 70 and 100 Å), made of tunnel oxide.

Basically, the function of the storage capacitor 2 is on the one hand, to enable for the LTC stage 1 to have a good coupling coefficient to favour the Fowler-Nordheim mechanism (tunnel effect) for the set and reset operations (storage and removal of charges in and from the floating node 4), and, on the other, to constitute the most significant part of the capacitance in the time constant. The function of the transfer capacitor 5 is to enable injection, or extraction, of charges into, or from, the floating node 4, coupled to which is also the storage capacitor 2, in particular by the tunnel effect, in a way altogether similar to what occurs for the floating-gate terminal of a non-volatile memory.

Each of the elementary discharge units 8 has characteristics, for example in terms of thickness of the corresponding dielectric layer, such as to have a non-negligible charge leakage over time, through the corresponding dielectric space. Furthermore, the overall resistance of the discharge element 6, defined jointly by the various elementary discharge units 8, is extremely high, for example of the order of T$\Omega$ or P$\Omega$.

The function of the discharge element 6 is to discharge in a controlled way, in a sufficiently long time interval (of the order of minutes or hours), the charge stored in the capacitor constituted by the parallel of the storage capacitor 2 and transfer capacitor 5.

In use, in the LTC stage 1 the following operations may be envisaged. A programming operation, the so-called set operation, can be performed for initialization of the charge in the storage capacitor 2, by applying a high potential difference, for example of a positive value, between the first and second biasing terminals 3a, 3b, and a consequent injection of electric charges through the transfer capacitor 5.

For example, a high positive voltage +HV (boosted with respect to a logic supply voltage, for instance, via a charge-pump stage) is applied on the first biasing terminal 3a, and a high negative voltage −HV is applied on the second biasing terminal 3b.

An operation of reset, or erasure, of the charge stored in the storage capacitor 2 can be performed by applying a high potential difference, for example of a negative value, between the first and second biasing terminals 3a, 3b, and a consequent extraction of charges through the transfer capacitor 5. For example, the high negative voltage −HV is applied on the first biasing terminal 3a, and the high positive voltage +HV is applied on the second biasing terminal 3b.

An operation of reading of the residual charge present in the storage capacitor 2, by detecting the voltage on the floating node 4, or on one or more of the intermediate nodes $N_i$, during discharge of the charge stored in the storage capacitor 2 (that was stored in a previous programming operation). This discharge occurs through the discharge element 6, with the first and second biasing terminals 3a, 3b set at ground, the discharge time constant RC being the product of the resistance of the discharge element 6 and of the overall capacitance of the storage capacitor 2 and transfer capacitor 5 (which are coupled in parallel together and to the discharge element 6).

As shown in greater detail in FIG. 2, a reading circuit 9 of the LTC stage 1 comprises an operational amplifier 10 (in particular an operational transconductance amplifier—OTA), operating as a comparator, which has a first input terminal 10a, for example the negative input terminal, coupled to the floating node 4, a second input terminal 10b, in the example the positive input terminal, receiving a comparison reference voltage $V_x$, of an appropriate value (generated in a per se known manner starting from a supply voltage), and an output 10c, which supplies an output voltage $V_{out}$, the value of which is indicative of the residual charge in the storage capacitor 2.

In particular, if the reading voltage $V_L$ on the floating node 4 has a given relation with the comparison reference voltage $V_x$ (for example, being lower or higher than the same comparison reference voltage $V_x$), the discharge of the storage capacitor 2 may be considered completed (for example, for the purpose of unblocking the electronic device that had previously been blocked due to detection of an attack attempt).

The value of the comparison reference voltage $V_x$ is thus chosen for setting the desired duration of the discharge interval also as a function of the value assumed by the reading voltage $V_L$ on the floating node 4 at the end of the programming step (or at the start of the reading step).

Likewise, as shown schematically in the aforesaid FIG. 1, further comparator stages (designated by $10_i$) may be provided, coupled to one or more of the intermediate nodes $N_i$, in order to detect the voltage on the intermediate nodes $N_i$ and compare it with a respective reference voltage.

The present Applicant has realized that the operation of reading the residual charge in the LTC stage 1 has a number of problems, which may render difficult its implementation.

In the first place, both positive charges (in which case the discharge evolves from a positive reading voltage to ground) and negative charges (in which case, the discharge evolves from a negative reading voltage to ground) may be stored in the storage capacitor 2. In fact, for reasons of reliability, it may in general be required that the charge stored in the storage capacitor 2 is also negative.

It is thus required for the reading circuit 9 to be able to operate also with negative reading voltages $V_L$, which entails, as it is shown in the aforesaid FIG. 2, the operational amplifier 10 having a first supply input 10d and also a second supply input 10e, receiving, respectively, a positive supply voltage $V_{cc}$ (>0) and a negative supply voltage $V_{ss}$ (<0). In addition, also the reference voltage $V_x$ should be able to assume negative values (requiring, for example, a purposely provided charge-pump stage for its generation).

In general, the presence of negative reading voltages $V_L$ thus entails an increase in the circuit complexity, and a corresponding increase in the area occupation in the integrated embodiment, as well as an increase in the electric-power consumption.

Moreover, in a known way, the need to set the negative circuitry (for example, for generation of the negative-voltage references) requires an increase in the latency times prior to execution of the reading operation, and thus prevents high reading speed from being reached.

A further problem that afflicts the reading circuit 9 is linked to the fact that, when the electronic device in which it is incorporated is off (in so-called "power off" conditions), discharge paths towards ground (for example, constituted by leakage paths of the junctions of MOS transistors) may be generated, for example within biasing circuits (of a known type, here and not illustrated) coupled to the biasing terminals 3a, 3b; these discharge paths may affect the discharge time constant RC of the LTC stage 1, modifying it. In fact, the resistance towards ground constituted by the alternative leakage discharge paths may in general be comparable with the resistance of the discharge element 6 of the LTC stage 1.

Basically, a significant spread of the value of the time constant may arise, on account of the aforesaid alternative leakage discharge paths in power-off condition.

SUMMARY

Embodiments of the present invention solve, at least in part, the aforesaid problems, and can provide an improved reading circuit for an LTC stage, having improved electrical performance.

According to an embodiment of the present invention, a reading circuit includes a charge-retention circuit stage for measurement of a time interval. The charge-retention circuit includes a storage capacitor coupled between a first biasing terminal and a floating node, and a discharge element coupled between the floating node and a reference terminal and designed to implement discharge of a charge stored in the storage capacitor by leakage through a corresponding dielectric. The reading circuit also includes an operational amplifier having a first input terminal coupled to the floating node and designed to receive a reading voltage, a second input terminal designed to receive a reference voltage, and an output terminal on which it is designed to supply an output voltage, the value of which is a function of the comparison between the reading voltage and the reference voltage and is indicative of a residual charge in the storage capacitor during its discharge. A shifting stage is configured to carry out a shift of the value of the reading voltage of the floating node, before performing the comparison between the reading voltage and the reference voltage to supply the output voltage indicative of the residual charge in the storage capacitor during its discharge.

Other embodiments are disclosed herein.

BRIEF DESCRIPTION OF THE DRAWINGS

For a better understanding of the present invention, a preferred embodiment thereof is now described, purely by way of non-limiting example and with reference to the attached drawings, wherein.

DETAILED DESCRIPTION OF ILLUSTRATIVE EMBODIMENTS

Figure 3:
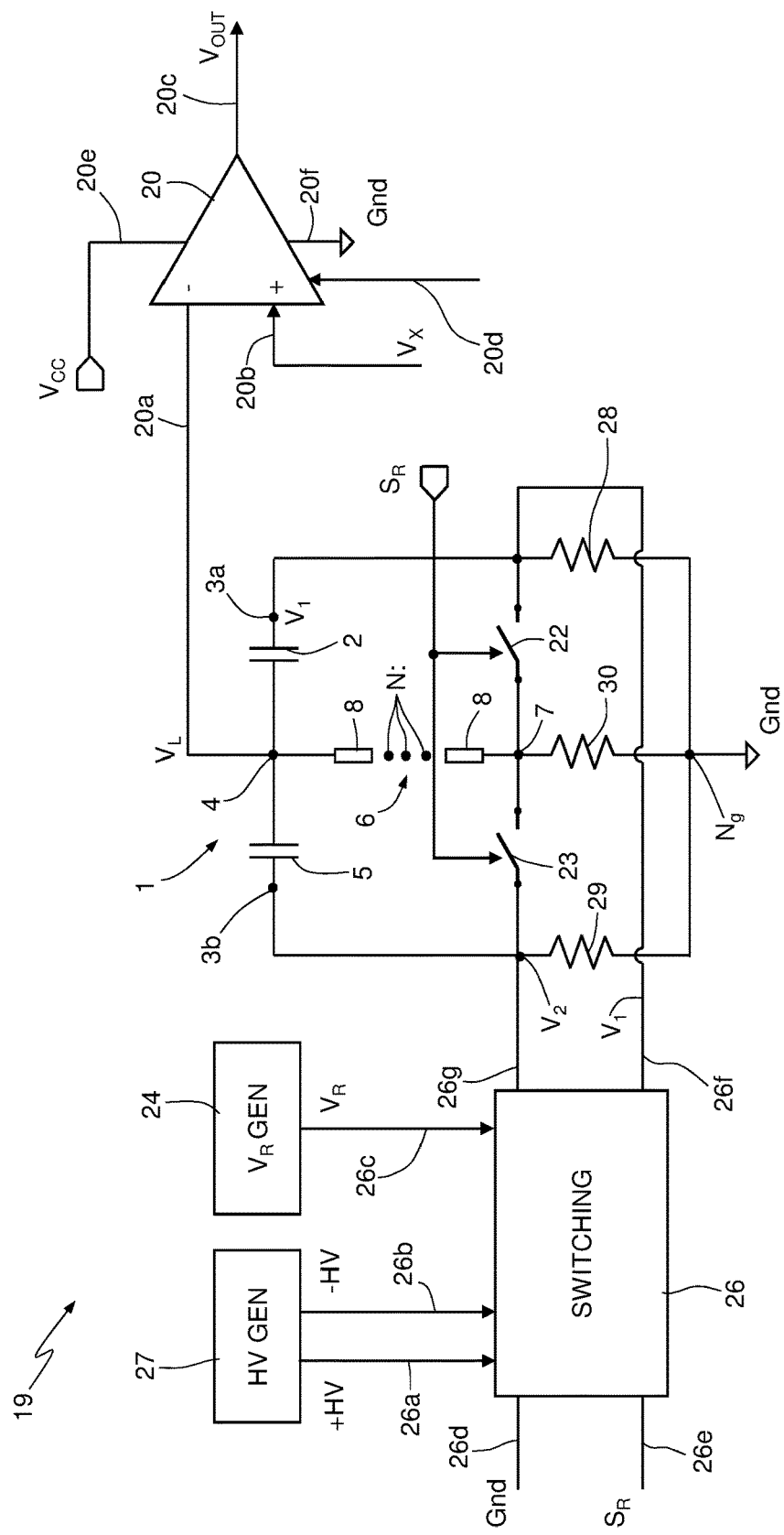
FIG. 3 shows a reading circuit for an LTC stage, according to one embodiment of the present solution.

FIG. 3 shows a reading circuit 19 for an LTC stage, once again designated by 1, which includes, as described previously (and as described in detail in the aforesaid US 2015/0043269 A1): the storage capacitor 2, coupled between the first biasing terminal 3a, set in use at the first biasing voltage $V_1$, and the floating node 4; the transfer capacitor 5, coupled between the second biasing terminal 3b, set in use at the second biasing voltage $V_2$, and the floating node 4; and the discharge element 6, coupled between the same floating node 4 and the reference terminal 7, and formed by a plurality of elementary discharge units 8, which are coupled together in series and define between them the internal nodes $N_i$.

The reading circuit 19 comprises an operational amplifier 20 (in particular, an operational transconductance amplifier—OTA), operating as a comparator, which has a first input terminal 20a, for example the negative input terminal, coupled to the floating node 4, a second input terminal 20b, in the example the positive input terminal, which receives a comparison reference voltage $V_x$, of an appropriate value, and an output 20c, which supplies the comparison voltage $V_{out}$, the value of which is indicative of the residual charge in the storage capacitor 2. The operational amplifier 20 further has an enabling input 20d, which receives a read-enable signal EN.

In particular, the operational amplifier 20 in this case comprises a first supply input 20e, which receives a positive supply voltage $V_{cc}$ (>0), for example 3.5 V, and a second supply input 20f, which receives the ground voltage gnd. According to a particular aspect of the present solution, the operational amplifier 20 is configured for operation in just the positive-voltage range and does not receive any negative supply voltage.

Thus, also the comparison reference voltage $V_x$ has an appropriate positive value, which satisfies the relation: $0 < V_x < V_{cc}$.

The reading circuit 19 further comprises a first switch element 22, which is coupled between the first biasing terminal 3a and the reference terminal 7 and is driven by a read control signal $S_R$ (received, for example, from a control unit of the electronic device, not illustrated herein, in which the LTC stage 1 is used). A second switch element 23 is coupled between the second biasing terminal 3b and the reference terminal 7 and is driven by the same read control signal $S_R$. a generator stage 24 is configured for generating, for example, starting from the positive supply voltage $V_{cc}$, a shifting voltage $V_R$, having an appropriate positive value (as described in detail hereinafter).

A voltage-switching stage 26 has a first voltage input 26a and a second voltage input 26b, which receive respectively the high positive voltage +HV and the high negative voltage −HV from a high-voltage generator stage 27 (of a known type, for example of the charge-pump type), a third voltage input 26c, which is coupled to the generator stage 24 and receives the shifting voltage $V_R$, a fourth voltage input 26d, which receives the ground voltage gnd, and also a control input 26e, which receives the read control signal $S_R$. The voltage-switching stage 26 further has a first output 26f and a second output 26g, which are coupled, respectively, to the first and second biasing terminals 3a, 3b, to which it supplies appropriate biasing voltage values ($V_1$ and $V_2$) during the operating conditions of the reading circuit 19 (as described in detail hereinafter).

In particular, the enable signal EN is conveniently timed with respect to the control signal $S_R$, for example being generated with switchings that are synchronized, or have an appropriate time delay, with respect to the switchings of the control signal $S_R$.

The reading circuit 19 further comprises a number of resistors. A first discharge resistor 28 is coupled between the first biasing terminal 3a and a ground node $N_g$ set at ground voltage gnd. A second discharge resistor 29 is coupled between the second biasing terminal 3b and the ground node $N_g$. A third discharge resistor 30 is coupled between the reference terminal 7 and the ground node $N_g$.

In particular, the resistance value of the first, second, and third discharge resistors 28, 29, 30 is much lower than the resistance of the discharge element 6, for example lower by at least one order of magnitude, for example in the order of megaohms.

In use, during the operation of programming (set) for initialization of the charge in the storage capacitor 2, the voltage-switching stage 26 sends, for example, the first biasing voltage $V_1$ to the high positive voltage +HV and the second biasing voltage $V_2$ to the high negative voltage −HV. Further, the read control signal $S_R$ determines opening of the first and second switch elements 22, 23.

During the operation of reset or erasure of the charge stored in the storage capacitor 2, the voltage-switching stage 26 brings, for example, the first biasing voltage $V_1$ to the high negative voltage −HV and the second biasing voltage $V_2$ to the high positive voltage +HV. The read control signal $S_R$ once again determines opening of the first and second switch elements 22, 23.

In both operating steps of programming and erasure, the value of resistance of the first, second, and third discharge resistors 28, 29, 30 is sufficiently high as to prevent an undesired current consumption by the high-voltage generator stage 27 (and by the corresponding charge-pump circuits).

Next, during discharge of the charge stored in the storage capacitor 2 through the discharge element 6, the voltage-switching stage 26 once again determines opening of the first and second switch elements 22, 23.

Figure 4:
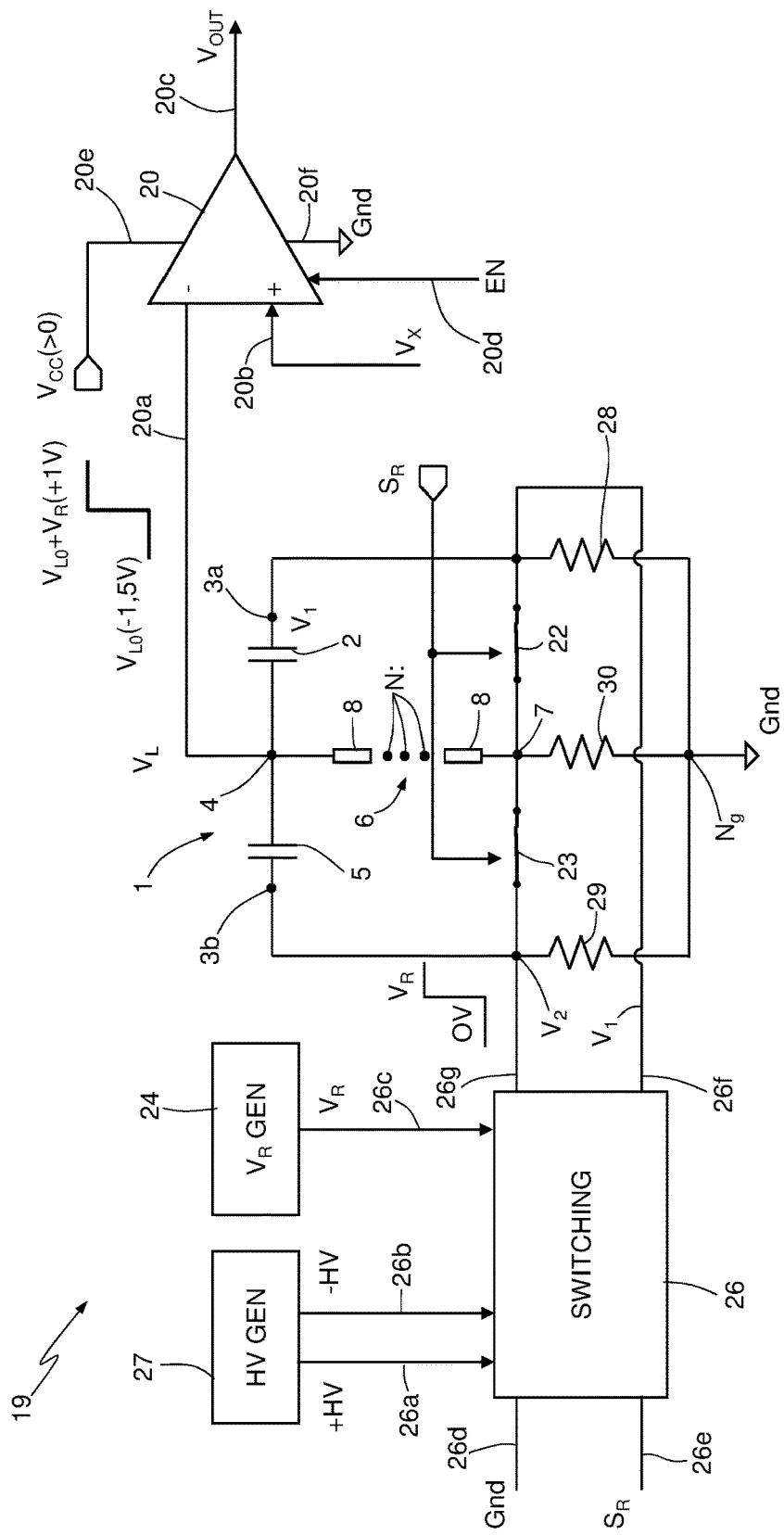
FIG. 4 shows the reading circuit of FIG. 3, in a read operating condition.

According to a particular aspect of the present solution, as illustrated in FIG. 4, the operation of reading of the residual charge present in the storage capacitor 2, by detecting the reading voltage $V_L$ on the floating node 4, envisages that the read control signal $S_R$ determines closing of the first and second switch elements 22, 23 (thus shorting the first and second biasing terminals 3a, 3b), and further that the voltage-switching stage 26 brings both the first biasing voltage $V_1$ and the second biasing voltage $V_2$ to the shifting voltage $V_R$. It should be noted that start of the reading step is in this case determined by switching of the read control signal $S_R$.

Consequently, the reading voltage $V_L$ increases instantaneously by a value equal to the shifting voltage $V_R$, assuming an incremented value: $V_L + V_R$.

In particular, the value of the shifting voltage $V_R$ is chosen so that, given the initial voltage value $V_{Lo}$ assumed at the end of the programming step, for example, negative and equal to −1.5 V, the following relation is satisfied:

$$V_{Lo}+V_R>0$$

For example, the value of the shifting voltage $V_R$ is 2.5 V, and the incremented value is initially 1 V (as illustrated in the aforesaid FIG. 4).

The generator stage 24 and the voltage-switching stage 26 thus operate jointly as a stage for shifting the reading voltage $V_L$ of the floating node 4, to bring the same reading voltage $V_L$ to positive values (and within the operating voltage range accepted by the operational amplifier 20) before carrying out the comparison with the comparison reference voltage $V_x$ and thus provide the indication of the residual charge in the storage capacitor 2.

Moreover, the value of the comparison reference voltage $V_x$ is chosen so that the following relation (valid in the case where the initial voltage $V_{Lo}$ has a negative value) is satisfied:

$$V_{Lo}+V_R<V_x<V_R$$

It should be noted that, advantageously, the operational amplifier 20 in this way works only with positive voltages at the input terminals 20a, 20b.

During discharge of the storage capacitor 2, on the hypothesis of a negative charge having been stored in the same storage capacitor 2, the reading voltage $V_L$ goes from the initial value $V_{Lo}$ to ground. Consequently, the incremented value $V_L+V_R$ evolves from the initial value $V_{Lo}+V_R$ to the value of the shifting voltage $V_R$.

When this incremented value crosses the value of the comparison reference voltage $V_x$, the output of the operational amplifier 20 switches, or triggers, and the comparison voltage $V_{out}$ assumes a value (for example, a high value) indicating the end of the discharge step.

In particular, the reading operation is enabled by the read-enable signal EN received by the operational amplifier 20 at the enabling input 20d.

It should be noted that the value of the comparison reference voltage $V_x$, which thus represents the triggering threshold of the operational amplifier 20, may thus be selected in an appropriate way to regulate the desired duration of the discharge step of the storage capacitor 2.

The advantages of the solution proposed emerge clearly from the foregoing description.

In any case, it is underlined once again that the reading circuit 19 allows solving of the problems highlighted previously, in so far as it enables use of an operational amplifier 20 operating with just positive voltages, thus preventing the need for purposely provided circuits for generation of negative references, and further preventing the associated reading delays; and it reduces the spread of the value of the discharge time constant, in particular during powering-off, thanks to introduction of effective discharge resistive paths towards the ground terminal.

In this regard, it should be noted that, in the power-off condition, advantageously the presence of the first and second discharge resistors 28, 29 ensures the presence of an effective discharge path from the biasing terminals 3a, 3b to ground. In particular, this discharge path prevents formation of alternative discharge leakage paths that might vary the value of the discharge time constant RC.

Instead, the resistance value of the discharge resistors 28, 29 is such as not to alter the value of the discharge time constant RC, this value of resistance being in fact considerably lower than the value of the resistance of the discharge element 6.

Basically, the solution described enables increase in the performance and reliability of the reading operations of the LTC stage 1.

Figure 1:
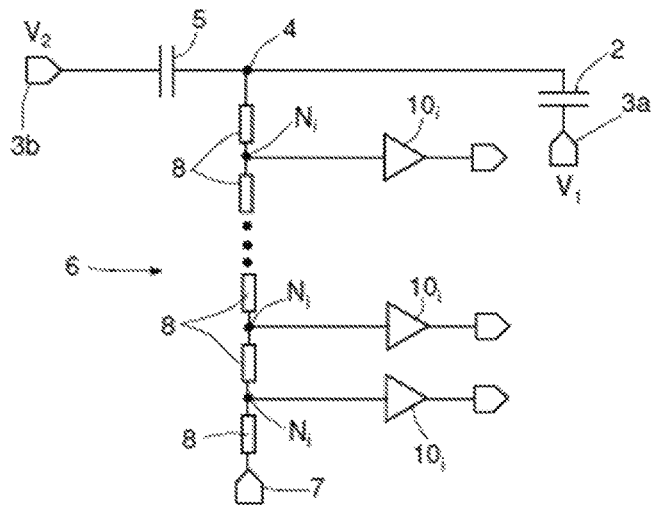
FIG. 1 shows the circuit diagram of an LTC stage of a known type.
Figure 2:
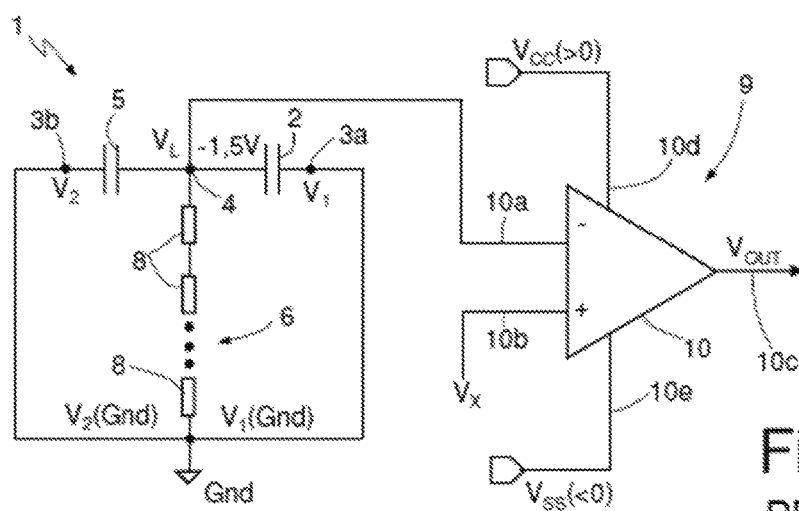
FIG. 2 shows a reading circuit associated to the LTC stage of FIG. 1, being also of a known type.
Figure 5:
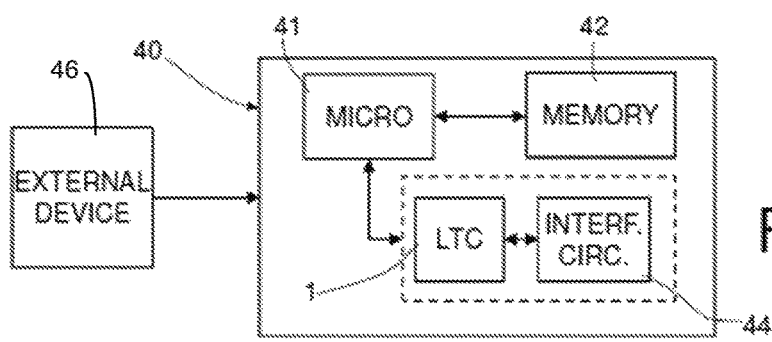
FIG. 5 is a general block diagram of an electronic device that incorporates the LTC stage and the corresponding reading circuit, according to a further aspect of the present solution.

The aforesaid characteristics thus render use of the LTC stage 1 and of the associated reading circuit 19 in an electronic device 40 advantageous, for example, for secure applications, as illustrated schematically in FIG. 5.

The electronic device 40 comprises a control unit 41, for example of the microprocessor or microcontroller type, which supervises its general operation, and a memory 42, of a non-volatile type, operatively coupled to the control unit 41.

The control unit 41 further comprises the LTC stage 1 and an associated electronic interface circuit 44, including the reading circuit 19 and further biasing circuits (not illustrated herein).

In particular, the control unit 41, following upon detection of an attempt at attack by an external electronic device 46 (for example, following upon detection of an unauthorised access to the information stored in the memory 42), may determine a blocking state of the electronic device 40. The control unit 41 may further read, for example at regular intervals, the residual charge stored in the storage capacitor 2 of the LTC stage 1, in order to determine exit from the blocking state, at the end of a wait interval of a preset duration (which, as described previously, may be appropriately regulated via the value of the comparison reference voltage $V_x$).

The electronic device 40 may advantageously be integrated in a portable mobile-communication apparatus (not illustrated), such as a cell phone, a smartphone, a personal digital assistant (PDA), a digital audio player with voice-recording capacity, a photographic camera or video camera, a controller for videogames, etc., or a wearable apparatus, such as a smartwatch or an electronic bracelet.

Finally, it is clear that modifications and variations may be made to what is described and illustrated herein, without thereby departing from the scope of the present invention, as defined in the annexed claims.

For example, it is evident that the numeric values indicated for the voltages acting in the reading circuit 19 are to be understood as provided purely by way of example, since in an equivalent way different values may be present, according to the particular operating requirements.

Furthermore, the LTC stage 1 and the corresponding reading circuit 19 may be used in different electronic devices, in general for secure applications. Other uses may in any case be envisaged, for example in the field of management of the timing for access rights to multimedia contents.

What is claimed is:

1. A circuit, comprising:
    a charge-retention circuit stage for measurement of a time interval, the charge-retention circuit stage having a storage capacitor coupled between a first biasing terminal and a floating node, and also having a discharge element coupled between the floating node and a reference terminal, the discharge element designed to implement discharge of a charge stored in the storage capacitor by leakage through a corresponding dielectric,
    an operational amplifier having a first input terminal coupled to the floating node and designed to receive a reading voltage, a second input terminal designed to receive a reference voltage, and an output terminal configured to supply an output voltage that has a value that is a function of a comparison between the reading voltage and the reference voltage and is indicative of a residual charge in the storage capacitor during its discharge; and a shifting stage, configured to carry out a shift of the value of the reading voltage of the floating node, before performing the comparison between the reading voltage and the reference voltage to supply the output voltage indicative of the residual charge in the storage capacitor during its discharge.

2. The circuit according to claim 1, wherein the shifting stage is configured to shift the reading voltage from a negative value to a positive value.

3. The circuit according to claim 1, wherein the shifting stage comprises:

a generator stage configured to generate a shifting voltage; and a switching stage, configured to receive the shifting voltage and to switch a voltage of the first biasing terminal and a second biasing terminal from a reference voltage to the shifting voltage, upon switching of a read control signal indicative of a start of a reading step of the residual charge in the storage capacitor.

4. The circuit according to claim 3, further comprising:

a first switch element, coupled between the first biasing terminal and the reference terminal, and driven by the read control signal; and a second switch element, coupled between the second biasing terminal and the reference terminal, and driven by the read control signal.

5. The circuit according to claim 3, wherein the shifting voltage has a value that, added to an initial value assumed by the reading voltage at start of a reading step, gives a positive voltage value.

6. The circuit according to claim 5, wherein the shifting voltage has a value that satisfies the following expression:

$$V_{Lo}+V_R<V_x<V_R$$

where $V_{Lo}$ is a value assumed by the reading voltage at the start of the reading step, $V_R$ is the value of the shifting voltage, and $V_x$ is the value of the reference voltage.

7. The circuit according to claim 1, wherein the operational amplifier has a first supply input designed to receive a positive supply voltage and a second supply input designed to receive a ground voltage, whereby the operational amplifier is designed to operate in a positive voltage range.

8. The circuit according to claim 1, wherein the charge-retention circuit stage further comprises a transfer capacitor coupled between a second biasing terminal and the floating node, wherein the transfer capacitor is designed to inject charges into, or extract charges from, the storage capacitor by a tunnel effect.

9. The circuit according to claim 8, further comprising:

a first discharge resistor coupled between the first biasing terminal and a ground node set at a ground voltage; and a second discharge resistor coupled between the second biasing terminal and the ground node, wherein a value of resistance of the first and second discharge resistors is lower than a respective value of resistance of the discharge element.

10. The circuit according to claim 9, further comprising a third discharge resistor coupled between the reference terminal and the ground node, wherein a value of resistance of the third discharge resistor is lower than a respective value of resistance of the discharge element by at least one order of magnitude.

11. The circuit according to claim 8, wherein the shifting stage comprises a switching stage, configured to receive a positive biasing voltage and a negative biasing voltage and to switch a respective biasing voltage of the first biasing terminal and the second biasing terminal to the value of the positive biasing voltage, or of the negative biasing voltage, in order to inject charges into, or extract charges from, the storage capacitor.

12. An electronic device comprising:

a control unit;

a non-volatile memory operatively coupled to the control unit; and the circuit according to claim 1 operatively coupled to the control unit for measurement of a time interval that corresponds to an interval of suspension of operation of the electronic device.

13. A circuit, comprising:

a capacitive charge storage element having a first electrode coupled to a floating node and a second electrode coupled to a first voltage node;

a charge flow circuit coupled to the floating node, the charge flow circuit comprising a plurality of elementary discharge elements coupled in series between the floating node and a second voltage node, wherein the capacitive charge storage element has a larger charge retention capacitance than the charge flow circuit; and a switching circuit with an output coupled to the first voltage node and selectively coupled to the second voltage node, the switching circuit having a first input coupled to a ground reference terminal and a second input coupled to a shift voltage terminal.

14. The circuit according to claim 13, wherein the output of the switching circuit comprises a first biasing voltage terminal, the switching circuit further comprising a second biasing voltage terminal, the circuit further comprising:

a second capacitive charge storage element having a first electrode coupled to the floating node and a second electrode coupled to the second biasing voltage terminal;

a first discharge resistor coupled between the first biasing voltage terminal and the ground reference terminal;

a second discharge resistor coupled between the second biasing voltage terminal and the ground reference terminal;

a first switching element coupled between the first biasing voltage terminal and the second voltage node; and a second switching element coupled between the second biasing voltage terminal and the second voltage node.

15. The circuit according to claim 14, wherein the switching circuit, the first switching element, and the second switching element each have a control input coupled to receive a read control signal.

16. The circuit according to claim 13, further comprising an operational amplifier having a first input coupled to the floating node and a second input coupled to a reference voltage node.

17. A reading method for a charge-retention circuit stage that includes a storage capacitor coupled between a first biasing terminal and a floating node, and also includes a discharge element coupled between the floating node and a reference terminal, the method comprising:

shifting a value of a reading voltage of the floating node; and after shifting, comparing the reading voltage of the floating node with a reference voltage in order to supply an output voltage that has a value that is a function of a result of the comparing and is indicative of a residual charge in the storage capacitor during its discharge.

18. The method according to claim 17, further comprising discharging a charge stored in the storage capacitor by leakage through a corresponding dielectric.

19. The method according to claim 17, wherein the shifting comprises shifting the reading voltage from a negative value to a positive value.

20. The method according to claim 17, wherein the shifting comprises:
generating a shifting voltage; and
switching a voltage of the first biasing terminal and a second biasing terminal from a reference voltage to the shifting voltage, upon switching of a read control signal indicative of the start of a reading step of the residual charge in the storage capacitor.

21. The method according to claim 20, wherein the shifting voltage has a value that, added to an initial value assumed by the reading voltage at the start of the reading step, gives a positive voltage value.

22. The method according to claim 21, wherein the shifting voltage has a value that satisfies the following expression:

$$V_{Lo}+V_R<V_x<V_R$$

where $V_{Lo}$ is a value assumed by the reading voltage at the start of the reading step, $V_R$ is the value of the shifting voltage, and $V_x$ is the value of the reference voltage.

* * * * *